(12) United States Patent
Wang et al.

(10) Patent No.: US 11,851,749 B2
(45) Date of Patent: Dec. 26, 2023

(54) SEMICONDUCTOR DEVICE, METHOD AND MACHINE OF MANUFACTURE

(71) Applicant: Taiwan Semiconductor Manufacturing Co., Ltd., Hsinchu (TW)

(72) Inventors: Jen-Chun Wang, Chiayi (TW); Ya-Lien Lee, Baoshan Township (TW); Chih-Chien Chi, Hsinchu (TW); Hung-Wen Su, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/826,809

(22) Filed: May 27, 2022

(65) Prior Publication Data
US 2022/0290291 A1 Sep. 15, 2022

Related U.S. Application Data

(62) Division of application No. 16/509,775, filed on Jul. 12, 2019, now Pat. No. 11,345,991.
(Continued)

(51) Int. Cl.
*C23C 14/35* (2006.01)
*H01L 21/768* (2006.01)
(Continued)

(52) U.S. Cl.
CPC .......... *C23C 14/35* (2013.01); *C23C 14/0036* (2013.01); *C23C 14/046* (2013.01); *C23C 14/0641* (2013.01); *C23C 14/225* (2013.01); *C23C 14/3492* (2013.01); *C23C 14/358* (2013.01); *C23C 16/045* (2013.01);
(Continued)

(58) Field of Classification Search
CPC ... C23C 14/35; C23C 14/0036; C23C 14/046; C23C 14/0641; C23C 14/225; C23C 14/3492; C23C 14/358; C23C 16/045; C23C 16/34; C23C 16/45525; H01J 37/3405; H01J 37/3458; H01J 37/3455; H01L 21/02183; H01L 21/02266; H01L 21/2855; H01L 21/67253; H01L 21/76831; H01L 21/76843; H01L 21/28568;
(Continued)

(56) References Cited

U.S. PATENT DOCUMENTS 5,298,136 A 3/1994 Ramalingam
5,744,017 A 4/1998 Tamagaki et al.
(Continued)

FOREIGN PATENT DOCUMENTS

KR 20130045062 * 5/2013

OTHER PUBLICATIONS

KR-20130045062 (MTD) (Year: 2013).*

*Primary Examiner* — Ahmed N Sefer
(74) *Attorney, Agent, or Firm* — Slater Matsil, LLP

(57) ABSTRACT

A semiconductor device is manufactured by modifying an electromagnetic field within a deposition chamber. In embodiments in which the deposition process is a sputtering process, the electromagnetic field may be modified by adjusting a distance between a first coil and a mounting platform. In other embodiments, the electromagnetic field may be adjusted by applying or removing power from additional coils that are also present.

20 Claims, 14 Drawing Sheets

Related U.S. Application Data

(60) Provisional application No. 62/737,358, filed on Sep. 27, 2018.

(51) Int. Cl.

| | | |
|---|---|---|
| *H01J 37/34* | (2006.01) | |
| *C23C 14/00* | (2006.01) | |
| *C23C 16/34* | (2006.01) | |
| *C23C 16/455* | (2006.01) | |
| *C23C 14/06* | (2006.01) | |
| *C23C 14/22* | (2006.01) | |
| *H01L 21/02* | (2006.01) | |
| *H01L 21/67* | (2006.01) | |
| *C23C 14/34* | (2006.01) | |
| *H01L 21/285* | (2006.01) | |
| *C23C 14/04* | (2006.01) | |
| *C23C 16/04* | (2006.01) | |
| *H01L 21/3205* | (2006.01) | |
| *H01L 23/532* | (2006.01) | |

(52) U.S. Cl.
CPC ........ *C23C 16/34* (2013.01); *C23C 16/45525* (2013.01); *H01J 37/3405* (2013.01); *H01J 37/3458* (2013.01); *H01L 21/02183* (2013.01); *H01L 21/02266* (2013.01); *H01L 21/2855* (2013.01); *H01L 21/67253* (2013.01); *H01L 21/76831* (2013.01); *H01L 21/76843* (2013.01); *H01L 21/28568* (2013.01); *H01L 21/32051* (2013.01); *H01L 23/53238* (2013.01)

(58) Field of Classification Search
CPC ......... H01L 21/32051; H01L 23/53238; H01L 21/76832; H01L 21/76834
See application file for complete search history.

(56) References Cited

U.S. PATENT DOCUMENTS

| | | | |
|---|---|---|---|
| 6,200,433 B1* | 3/2001 | Ding | C23C 14/358 |
| | | | 204/192.15 |
| 6,245,190 B1 | 6/2001 | Masuda et al. | |
| 6,562,715 B1 | 5/2003 | Chen et al. | |
| 6,652,718 B1 | 11/2003 | D'Couto et al. | |
| 7,704,886 B2 | 4/2010 | Su et al. | |
| 8,500,967 B2* | 8/2013 | Nagata | H01J 37/32055 |
| | | | 204/298.41 |
| 2003/0085000 A1 | 5/2003 | Horioka et al. | |
| 2003/0116427 A1 | 6/2003 | Ding et al. | |
| 2003/0141018 A1* | 7/2003 | Stevens | H01L 21/67126 |
| | | | 118/728 |
| 2003/0141285 A1* | 7/2003 | Tachino | H01J 37/32458 |
| | | | 219/121.54 |
| 2004/0055880 A1 | 3/2004 | Gung et al. | |
| 2005/0006222 A1 | 1/2005 | Ding et al. | |
| 2006/0014378 A1 | 1/2006 | Aggarwal et al. | |
| 2006/0076232 A1 | 4/2006 | Miller et al. | |
| 2009/0215224 A1* | 8/2009 | Li | H01L 31/0322 |
| | | | 438/102 |
| 2010/0096255 A1 | 4/2010 | Ye et al. | |
| 2011/0094995 A1* | 4/2011 | Yamazawa | H01J 37/321 |
| | | | 216/68 |
| 2012/0097527 A1* | 4/2012 | Kodaira | C23C 14/351 |
| | | | 204/192.12 |
| 2012/0111722 A1 | 5/2012 | Kodaira et al. | |
| 2012/0325777 A1* | 12/2012 | Okumura | H01J 37/3211 |
| | | | 118/723 R |
| 2013/0187546 A1 | 7/2013 | Lin et al. | |
| 2015/0206756 A1* | 7/2015 | Gandikota | H01L 21/28568 |
| | | | 438/785 |
| 2019/0198334 A1 | 6/2019 | Zhang et al. | |
| 2019/0348259 A1* | 11/2019 | West | H01J 37/3447 |
| 2022/0208421 A1* | 6/2022 | Gulian | H01F 10/30 |

* cited by examiner

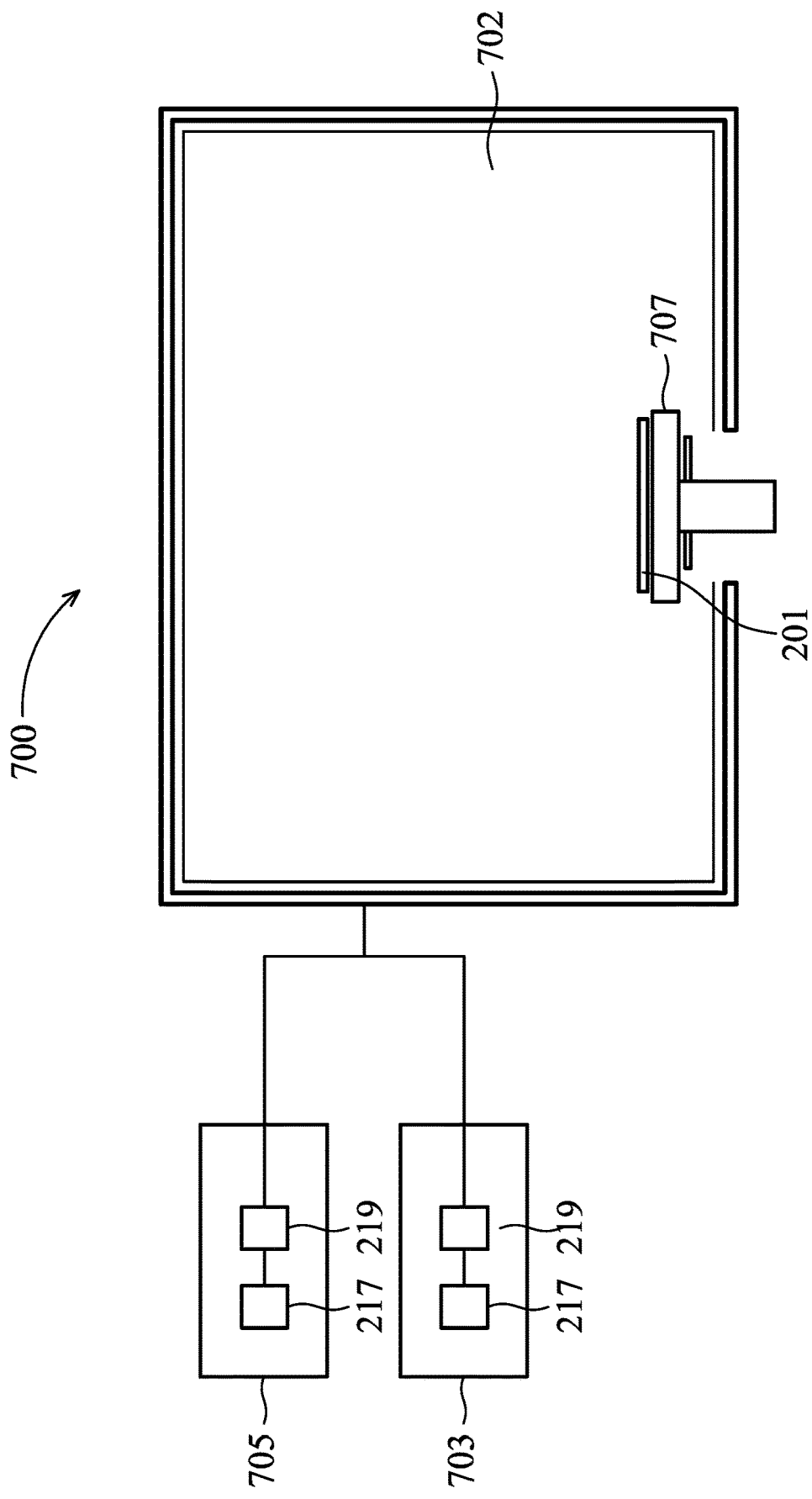

SEMICONDUCTOR DEVICE, METHOD AND MACHINE OF MANUFACTURE

PRIORITY CLAIM AND CROSS-REFERENCE

This application is a divisional of U.S. patent application Ser. No. 16/509,775, filed on Jul. 12, 2019, which claims the benefit of U.S. Provisional Patent Application No. 62/737,358, entitled "Semiconductor Device, Method and Machine of Manufacture," filed on Sep. 27, 2018, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7B illustrate a deposition of an atomic layer deposition layer in accordance with some embodiments.

DETAILED DESCRIPTION

Figure 1:
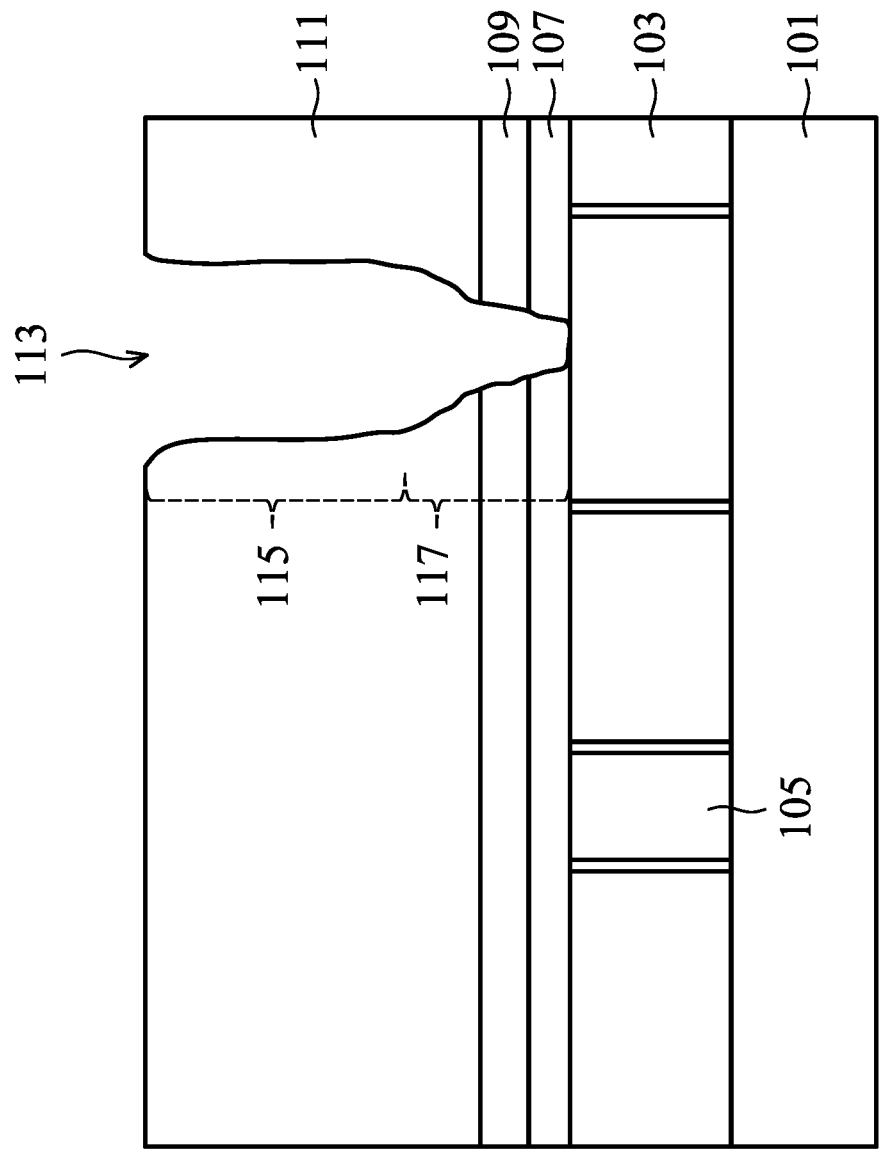
FIG. 1 illustrates a formation of a first opening in a first dielectric layer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described below with respect to a deposition process to form a barrier layer within an interconnect structure of a semiconductor device. Embodiments, however, may be used in a wide variety of ways, and are not intended to be limited to the embodiments described herein.

With reference now to FIG. 1, FIG. 1 illustrates a substrate 101 with active devices (not separately illustrated), metallization layers 103 over the substrate 101, conductive elements 105 within the metallization layers 103, an optional first etch stop layer 107, an optional second etch stop layer 109, and a first dielectric layer 111. In an embodiment the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the substrate 101.

The metallization layers 103 are formed over the substrate 101 and the active devices and are designed to connect the various active devices to form functional circuitry for the design. In an embodiment the metallization layers are formed of alternating layers of dielectric and conductive material and may be formed through any suitable process (such as deposition, damascene, dual damascene, etc.). In an embodiment there may be one to twelve layers of metallization separated from the substrate 101 by at least one interlayer dielectric layer (ILD), but the precise number of metallization layers is dependent upon the design.

The conductive elements 105 may be formed in an upper portion of the metallization layers 103, and is a region to which an interconnect 401 (not illustrated in FIG. 1 but illustrated and described below with respect to FIG. 4) will make physical and electrical connection. In an embodiment the conductive elements 105 may be a material such as copper formed using, e.g., a damascene or dual damascene process, whereby an opening is formed within an upper portion of the metallization layers 103, the opening is filled and/or overfilled with a conductive material such as copper, and a planarization process is performed to embed the conductive material within the metallization layers 103. However, any suitable material and any suitable process may be used to form the conductive elements 105.

A first etch stop layer 107 is used to protect the underlying structures and provide a control point for a subsequent etching process through, e.g., the second etch stop layer 109. In one embodiment, the first etch stop layer 107 may be formed of silicon oxide, silicon nitride, silicon carbon nitride (SiCN), silicon carbon oxide (SiCO), or a metal oxide or nitride such as aluminum oxide ($AlO_x$), $AlN_x$, $AlO_xN_y$, $TiO_x$, $TiO_xN_y$, $ZnO_x$, $MnO_x$, combinations of these, or the like. The first etch stop layer 107 may be formed using plasma enhanced chemical vapor deposition (PECVD), plasma enhanced atomic layer deposition (PEALD), thermal atomic layer deposition, or physical vapor deposition process. The first etch stop layer 107 may have a thickness of between about 5 Å and about 100 Å, such as about 30 Å.

Once the first etch stop layer 107 has been formed to cover the conductive elements 105, the second etch stop layer 109 is formed over the first etch stop layer 107 to protect the underlying structures and provide a control point for a subsequent etching process through, e.g., the first dielectric layer 111. In one embodiment, the second etch stop layer 109 may be formed of silicon oxide, silicon nitride, silicon carbon nitride (SiCN), silicon carbon oxide (SiCO), or a metal oxide or nitride such as aluminum oxide ($AlO_x$), $AlN_x$, $AlO_xN_y$, $TiO_x$, $TiO_xN_y$, $ZnO_x$, $MnO_x$, combinations of these, or the like. The second etch stop layer 109 may be formed using plasma enhanced chemical vapor deposition (PECVD), plasma enhanced atomic layer deposition (PEALD), thermal atomic layer deposition, or physical vapor deposition process. The second etch stop layer 109 may have a thickness of between about 25 Å and about 100 Å, such as about 40 Å.

Once the second etch stop layer 109 has been formed, the first dielectric layer 111 may be formed in order to help isolate the interconnect 401 from other adjacent electrical routing lines. In an embodiment the first dielectric layer 111 may be, e.g., a low-k dielectric film intended to help isolate the interconnect 401 from other structures, such as a porous material such as SiOCN, SiCN, SiOC, combinations of these, or the like. The first dielectric layer 111 may be formed by first depositing a matrix material along with a porogen and then removing the porogen in order to form pores within the matrix material. However, any suitable material or method of manufacture may be utilized.

FIG. 1 additionally illustrates a patterning of the first dielectric layer 111, the second etch stop layer 109, and the first etch stop layer 107 to form a first opening 113 with, e.g., a trench portion 115 and a via portion 117. In an embodiment the first opening 113 may be formed using either a via-first or a via-last patterning process, whereby a series of two or more photoresists (which may be, e.g., tri-layer photoresists which include a bottom anti-reflective coating, a middle layer hard mask, and a photosensitive material) are placed over the first dielectric layer 111 and patterned, and then the patterns are transferred to the first dielectric layer 111, the second etch stop layer 109 (when present), and the first etch stop layer 107 (when present) through a series of one or more anisotropic etches, such as one or more reactive ion etches. However, any suitable methods, such as double patterning methods, may be utilized to pattern the first dielectric layer 111, the second etch stop layer 109, and the first etch stop layer 107 and form the first opening 113.

Figure 2A:
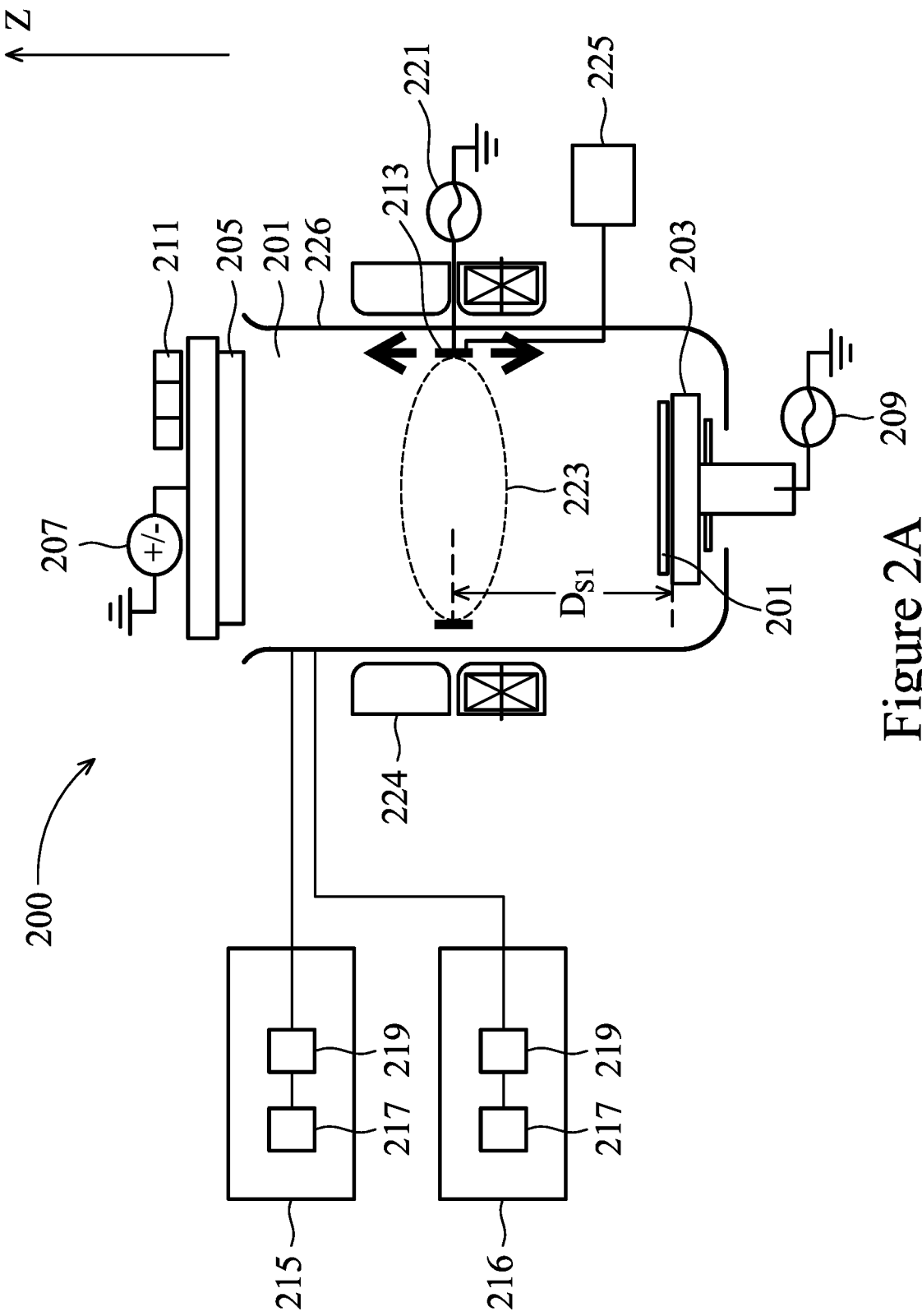
FIGS. 2A-2C illustrate deposition of a first layer of a material within the first opening in accordance with some embodiments.
Figure 2B:
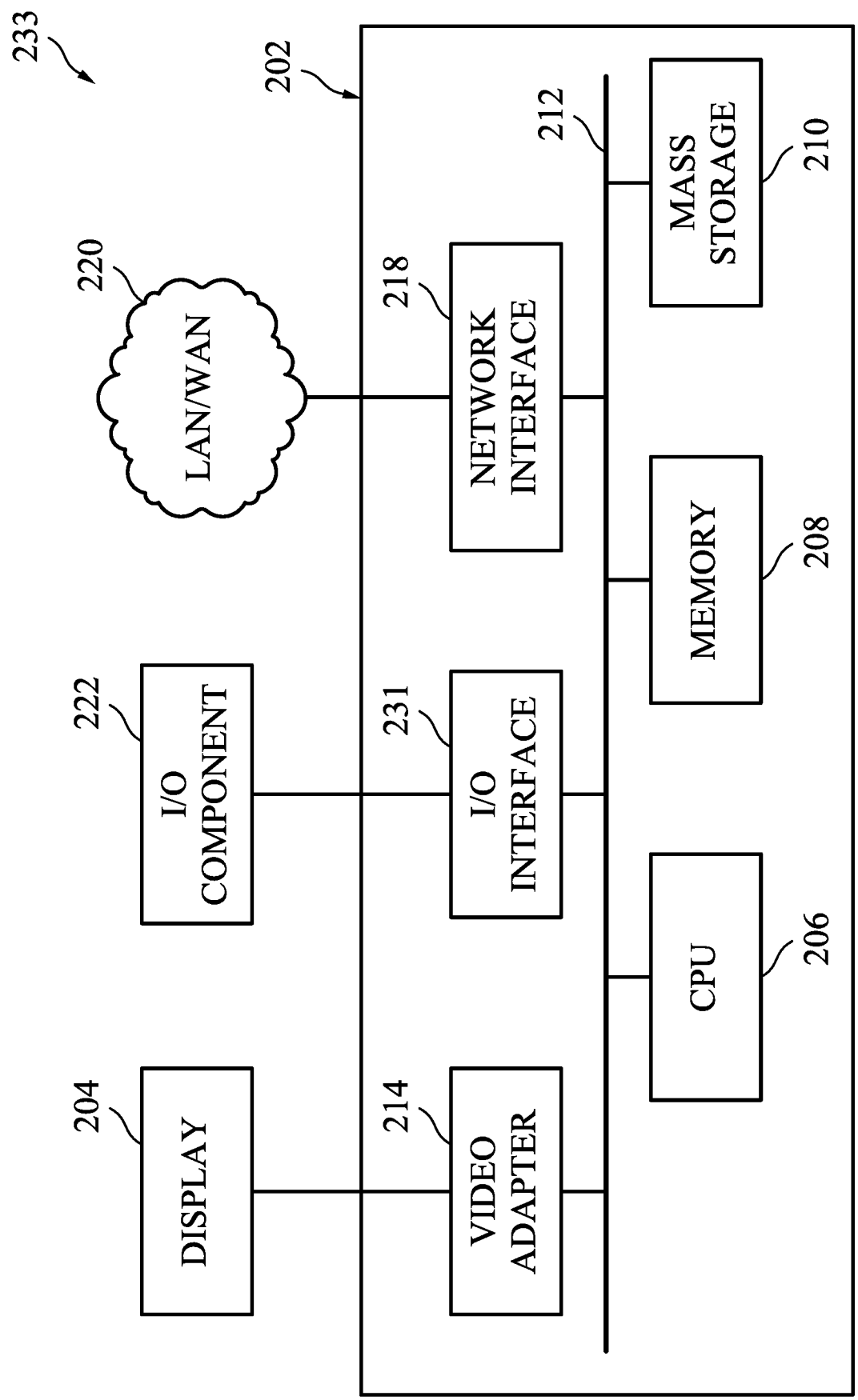
Figure 2C:
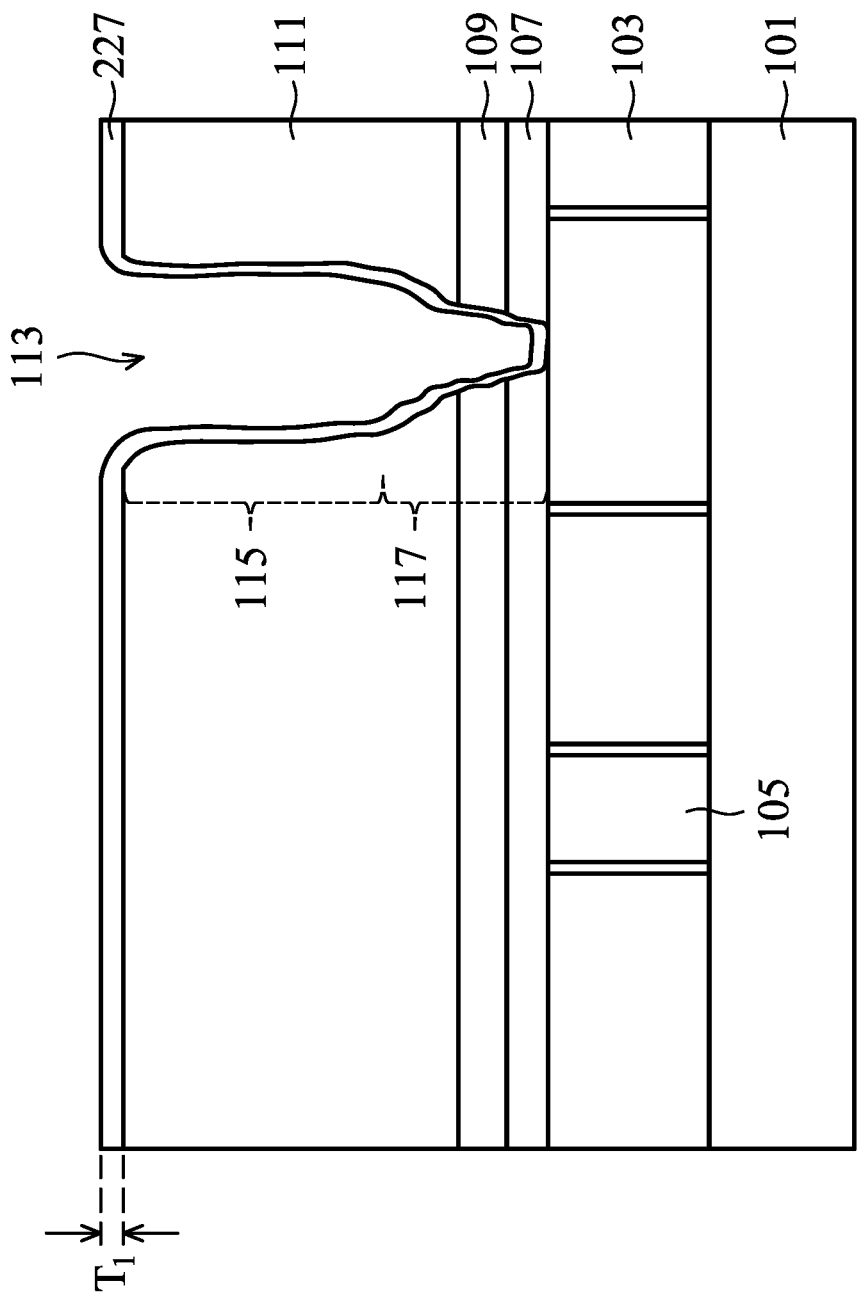

FIGS. 2A-2C illustrate that, once the first opening 113 has been formed through the first dielectric layer 111, the substrate 101 (and, hence, the first dielectric layer 111 with the first opening 113) may be placed within a deposition system 200 to form a barrier layer 301 (not separately illustrated in FIGS. 2A-2C but illustrated and described below with respect to FIG. 3) which covers the sidewalls of the first opening 113. In an embodiment the deposition system 200 comprises a deposition chamber 201, a mounting platform 203, a target 205, a first power source 207, a second power source 209, electromagnets 224, a magnetron 211, a first coil 213, a first precursor delivery system 215, and a first ion delivery system 216.

The deposition chamber 201 receives the substrate 101 (and, hence, the first dielectric layer 111 with the first opening 113) and contains the precursor and process materials during the deposition process. The deposition chamber 201 may be any desired shape that may be suitable for dispersing the materials and contacting the materials with the first dielectric layer 111. In the embodiment illustrated in FIG. 2A, the deposition chamber 201 has a cylindrical sidewall and a bottom. However, the deposition chamber 201 is not limited to a cylindrical shape, and any other suitable shape, such as a hollow square tube, an octagonal shape, or the like, may be utilized. Furthermore, the deposition chamber 201 may be surrounded by a housing 226 made of material that is inert to the various process materials. As such, while the housing 226 may be any suitable material that can withstand the chemistries and pressures involved in the deposition process, in an embodiment the housing 226 may be steel, stainless steel, nickel, aluminum, alloys of these, combinations of these, and like.

Within the deposition chamber 201 the substrate 101 may be placed on a mounting platform 203 in order to position and control the substrate 101 and the first opening 113 during the deposition processes. The mounting platform 203 may be, e.g., an electrostatic chuck, which provides electrostatic charges to clamp the substrate 101 to the mounting platform 203 without mechanical fasteners. The mounting platform 203 may also include heating mechanisms in order to heat the substrate 101 during the deposition processes. However, any suitable method of holding the substrate 101 may be utilized. Furthermore, while a single mounting platform 203 is illustrated in FIG. 2A, any number of mounting platforms 203 may additionally be included within the deposition chamber 201.

Additionally, the deposition chamber 201 and the mounting platform 203 may be part of a cluster tool system (not shown). The cluster tool system may be used in conjunction with an automated handling system in order to position and place the substrate 101 into the deposition chamber 201 prior to the deposition processes, position and hold the substrate 101 during the deposition processes, and remove the substrate 101 from the deposition chamber 201 after the deposition processes.

On an opposite side of the deposition chamber, the target 205 may be placed into a target region such that the substrate 101 faces the target 205 while the substrate 101 is located on the mounting platform 203. The target 205 comprises a material that is either desired to be deposited onto the substrate 101 (e.g., within the first opening 113) or else comprises a material that is a precursor material to the material that is desired to be deposited onto the substrate 101. As such, while the material of the target 205 is dependent at least in part on the material that is desired to be deposited, in an embodiment in which the barrier layer 301 is tantalum nitride, the target 205 comprises a precursor material such as tantalum. However, any suitable material may be utilized.

Additionally, in an embodiment in which the target 205 provides one or more, but not all, of the precursors desired to be deposited, a first precursor delivery system 215 may also be provided in order to supply a non-target precursor to the deposition chamber 201 while a first ion delivery system 216 may be provided in order to supply an ion source for the sputtering process. In an embodiment the first precursor delivery system 215 and the first ion delivery system 216 may each include a gas supply 217 and a flow controller 219. In an embodiment in which the non-target precursor and the ion source are stored in a gaseous state, the gas supply 217 may be a vessel, such as a gas storage tank, that is located either locally to the deposition chamber 201 or else may be located remotely from the deposition chamber 201. Alternatively, the gas supply 217 may be a facility that independently prepares and delivers the non-target precursor and the ion source to the flow controller 219. Any suitable source for the non-target precursor and the ion source may be utilized as the gas supply 217, and all such sources are fully intended to be included within the scope of the embodiments.

The gas supply 217 may supply the desired non-target precursor and the ion source to their respective flow controllers 219. The flow controllers 219 may be utilized to control the flow of the non-target precursor and the ion source to the deposition chamber 201, thereby also helping to control the pressure within the deposition chamber 201. In one embodiment the desired non-target precursor and the ion source may be directed to enter the deposition chamber 201 through a sidewall (e.g., at a top, middle, or bottom of the sidewalls) of the deposition chamber 201 or else through the bottom or top of the deposition chamber 201. However, any suitable location of entry may be utilized.

The flow controllers 219 may be, e.g., a proportional valve, a modulating valve, a needle valve, a pressure regulator, a mass flow controller, combinations of these, or the like. However, any suitable method for controlling and regulating the flow of the non-target precursor and the ion source to the deposition chamber 201 may be utilized, and all such components and methods are fully intended to be included within the scope of the embodiments.

Additionally, in an embodiment in which the non-target precursor or the ion source is stored in a solid or liquid state, the gas supply 217 may store a carrier gas and the carrier gas may be introduced into a precursor canister (not separately illustrated), which stores the non-target precursor and the ion source in the solid or liquid state. The carrier gas is then used to push and carry the non-target precursor as it either evaporates or sublimates into a gaseous section of the precursor canister before being sent to the deposition chamber 201. Any suitable method and combination of units may be utilized to provide the non-target precursor and the ion source, and all such combinations of units are fully intended to be included within the scope of the embodiments.

In an embodiment the ion source is chosen so as to be able to impinge upon the target 205 and dislodge or otherwise remove portions of the target 205 without otherwise reacting with the material of the target 205 or other by-products that may occur. As such, while the precise source of ions may be dependent at least in part upon the materials chosen, in an embodiment in which tantalum nitride is being deposited with a tantalum target, the ion source may be an inert gas such as argon. However, any suitable source of ions may be utilized.

The non-target precursor is chosen so as to react with the precursor from the target 205 in order to form the material that is desired to be deposited. As such, the precise material chosen for the non-target precursor is dependent at least in part upon the material desired to be deposited as well as the material chosen for the target 205. However, in an embodiment in which the material to be deposited is tantalum nitride and the target 205 is tantalum, the non-target precursor may be a material such as nitrogen ($N_2$). However, any suitable material may be chosen for the non-target precursor.

On an opposite side of the target 205 from the mounting platform 203, a magnetron 211 may be formed in order to help generate a magnetic field within the deposition chamber 201 and help generate a high-density plasma region within the deposition chamber 201. The magnetron 211 may comprise one or more magnets (e.g., LDR magnets) which may be either stationary or movable with respect to the target 205. However, any suitable type or configuration of magnetron 211 may be utilized.

Electromagnets 224, often referred to as bottom inside magnets (BIM) and/or bottom outside magnets (BOM), are deployed surrounding the region directly over the substrate 101. In an embodiment, the electromagnets 224 are also in proximity to the substrate 101, and may be wrapped around the first coil 213. The electromagnets 224 help to improve the uniformity in the deposition process.

The first power source 207 and the second power source 209 may be operated independently from each other. Each of the first power source 207 and the second power source 209 may be independently powered on and off without affecting the other. In an embodiment, the connection of each of the first power source 207 and the second power source 209 may be switched in polarity to either cause a deposition on the substrate 101, or in another embodiment cause an etching on the substrate 101. As one skilled in the art will realize, whether the combination of the first power source 207 and the second power source 209 performs a deposition function or an etching function is determined by how the power source is connected, and to which of the target side or the wafer side it is connected to. For example, for a deposition process the first power source 207 and the second power source 209 may set up a bias function to direct sputtered species to deposit over the substrate 101, while for an etching process the bias function is utilized to direct ions to resputter or etch the substrate 101.

In an embodiment, a DC power source is connected to the target 205, and a RF power source is connected to the substrate 101. In another embodiment, the RF power source may be connected to the target 205, while the DC power source may be connected to the substrate 101. The first power source 207 and the second power source 209 may also be replaced by other power sources for bias sputter, magnetron sputter, ion metal plasma (IMP) sputter, and the like, and may be connected in different combinations. For the purpose of simplifying the following discussions, the first power source 207 is referred to as a DC power source, and the second power source 209 is referred to as a RF power source. Further, it is assumed the DC power source has its negative end connected to the target 205 and hence the second power source 209 performs the deposition function.

The first coil 213 is positioned to be wrapped around a first region of the deposition chamber 201 directly over where the substrate 101 (and, hence, the first opening 113)

will be placed when it is located on the mounting platform 203. In an embodiment the first coil 213 is utilized to either generate or help improve the distribution of ions within the deposition chamber 201 (e.g., the ionization of the tantalum ions, the argon ions, and the nitrogen ions in an embodiment in which tantalum nitride is being deposited).

The first coil 213 may be formed of a material that is the same as the target 205. As such, in an embodiment in which the target 205 is tantalum, the first coil 213 may also be tantalum. However, any suitable material may be utilized for the first coil 213.

In an embodiment the first coil 213 comprises a ring-type electromagnet in which a plurality of turns of a single conductive wire extend around the outside of the deposition chamber 201. For example, in one embodiment the first coil 213 comprises a number of turns between about 2 turns and about 300, such as about 198 turns. Additionally, the first coil 213 may have a first diameter (around the interior or exterior of the housing 226) between about 100 nm and about 600 mm, such as about 350 mm. However, any suitable number of turns and any suitable dimensions may be utilized.

To generate a desired first electromagnetic field 223 within the deposition chamber 201, the first coil 213 is connected to a third power source 221. In an embodiment the third power source 221 is an RF power source that can apply an RF power of between about 1 MHz and about 40 MHz, such as about 2 MHz. However, any suitable power source may be utilized.

When the third power source 221 applies power to the first coil 213 as the first coil 213 extends around the deposition chamber 201, the first coil 213 will generate the first electromagnetic field 223 within the deposition chamber 201. In an embodiment the application of power from the third power source 221 to the first coil 213 may generate the first electromagnetic field 223 within the deposition chamber 201.

Additionally, because the first electromagnetic field 223 can adjust an ionization area within the deposition chamber 201, the first electromagnetic field 223 can also affect the off angle deposition (e.g., the deposition of the material at an angle that is not normal to the target) of the material that is being deposited onto the substrate 101 (e.g., tantalum nitride). As such, by adjusting the first electromagnetic field 223, the off angle deposition may also be adjusted and, as such, a more conformal coverage of the deposition may be obtained.

FIG. 2B illustrates an embodiment of a control unit 233 that may be utilized to control the deposition system 200 and, in other embodiments described further below with respect to FIGS. 7A-8B, an atomic layer deposition system 700. The control unit 233 may be any form of computer processor that can be used in an industrial setting for controlling process machines. In an embodiment the control unit 233 may comprise a processing unit 202, such as a desktop computer, a workstation, a laptop computer, or a dedicated unit customized for a particular application. The control unit 233 may be equipped with a display 204 and one or more input/output components 222, such as instruction outputs, sensor inputs, a mouse, a keyboard, printer, combinations of these, or the like. The processing unit 202 may include a central processing unit (CPU) 206, memory 208, a mass storage device 210, a video adapter 214, and an I/O interface 231 connected to a bus 212.

The bus 212 may be one or more of any type of several bus architectures including a memory bus or memory controller, a peripheral bus, or video bus. The CPU 206 may comprise any type of electronic data processor, and the memory 208 may comprise any type of system memory, such as static random access memory (SRAM), dynamic random access memory (DRAM), or read-only memory (ROM). The mass storage device 210 may comprise any type of storage device configured to store data, programs, and other information and to make the data, programs, and other information accessible via the bus 212. The mass storage device 210 may comprise, for example, one or more of a hard disk drive, a magnetic disk drive, or an optical disk drive.

The video adapter 214 and the I/O interface 231 provide interfaces to couple external input and output devices to the processing unit 202. As illustrated in FIG. 2B, examples of input and output devices include the display 204 coupled to the video adapter 214 and the I/O component 222, such as a mouse, keyboard, printer, and the like, coupled to the I/O interface 231. Other devices may be coupled to the processing unit 202, and additional or fewer interface cards may be utilized. For example, a serial interface card (not shown) may be used to provide a serial interface for a printer. The processing unit 202 also may include a network interface 218 that may be a wired link to a local area network (LAN) or a wide area network (WAN) 220 and/or a wireless link.

It should be noted that the control unit 233 may include other components. For example, the control unit 233 may include power supplies, cables, a motherboard, removable storage media, cases, and the like. These other components, although not shown in FIG. 2B, are considered part of the control unit 233.

FIG. 2A additionally helps to illustrate one embodiment in which the first coil 213 can be used to modify the first electromagnetic field 223. In this embodiment the first coil 213 is initially located a first separation distance $D_{S1}$ away from the mounting platform 203. Additionally, in order to adjust the position of the first coil 213, a first motor 225 may be attached to the first coil 213 in order to adjust the position of the first coil 213 relative to the mounting platform 203 (with or without moving the mounting platform 203) and, hence the substrate 101 located on the mounting platform 203. In an embodiment the first motor 225 comprises a piezoelectric motor or a linear motor, although the first motor 225 may also comprise other types of motors. The first motor 225 may be adapted to adjust a z position of the first coil 213, both positively and negatively. However, any suitable method of adjusting the z position of the first coil 213 may be utilized.

In a particular embodiment the first motor 225 may modify the relative distance between the first coil 213 and the mounting platform 203 over a first range of distances. For example, the first motor 225 may move the first coil 213 from a position closest to the mounting platform 203 of about 0 mm to a position furthest from the mounting platform 203 of about 110 mm. However, any suitable range for the first range of distances may be utilized.

To initiate the deposition of the barrier layer 301 within the first opening 113, and as illustrated in FIG. 2A, a first step of the deposition process includes placing the substrate 101 onto the mounting platform 203 and within the deposition chamber 201. At that time, the first coil 213 is placed at the first separation distance $D_{S1}$ of between about 5 mm and about 500 mm, such as about 20 mm. Additionally, the pressure within the deposition chamber 201 may be set between about 0.001 torr and about 0.01 torr, such as about 0.003 torr, while the temperature of the substrate 101 may be set between about room temperature and about 450° C., such as about 300° C.

The first power source 207 (connected to the target 205) may also be set to a power of between about 500 W and about 40,000 W, such as about 1,000 W, and the second power source 209 (connected to the substrate 101) may be set to a power of between about 2 MHz and about 40 MHz, such as about 13.56 MHz. Finally, the third power source 221 (connected to the first coil 213) may also be set to a power of between about 1 MHz and about 40 MHz, such as about 2 MHz. In embodiments in which additional precursors, such as the non-target precursor, are utilized, a flow rate of the non-target precursor (e.g., $N_2$) may be set to be between about 0 sccm and about 40 sccm, such as about 15 sccm, while the ion source (e.g., argon) may be set to have a flow rate of between about 0 sccm and about 50 sccm, such as about 30 sccm. However, any suitable process parameters may be utilized for the first stage of deposition.

FIG. 2C illustrates that the first step of the deposition process will deposit a first layer 227 of the material to be deposited (e.g., tantalum nitride). The first step of the deposition process may be performed for a first time period of between about 10 sec and about 1000 sec, such as about 100 sec, which can result in a first thickness $T_1$ of between about 3 Å and about 40 Å, such as about 10 Å. Additionally, in an embodiment in which the barrier layer 301 is formed from tantalum nitride, and in which nitrogen is added as a non-target precursor, the first layer 227 of the material may be formed to have a first tantalum to nitrogen ratio (Ta/N) of between about 0.3 and about 1, such as about 0.6. However, any suitable time period, thickness, or composition may be utilized.

Figure 3A:
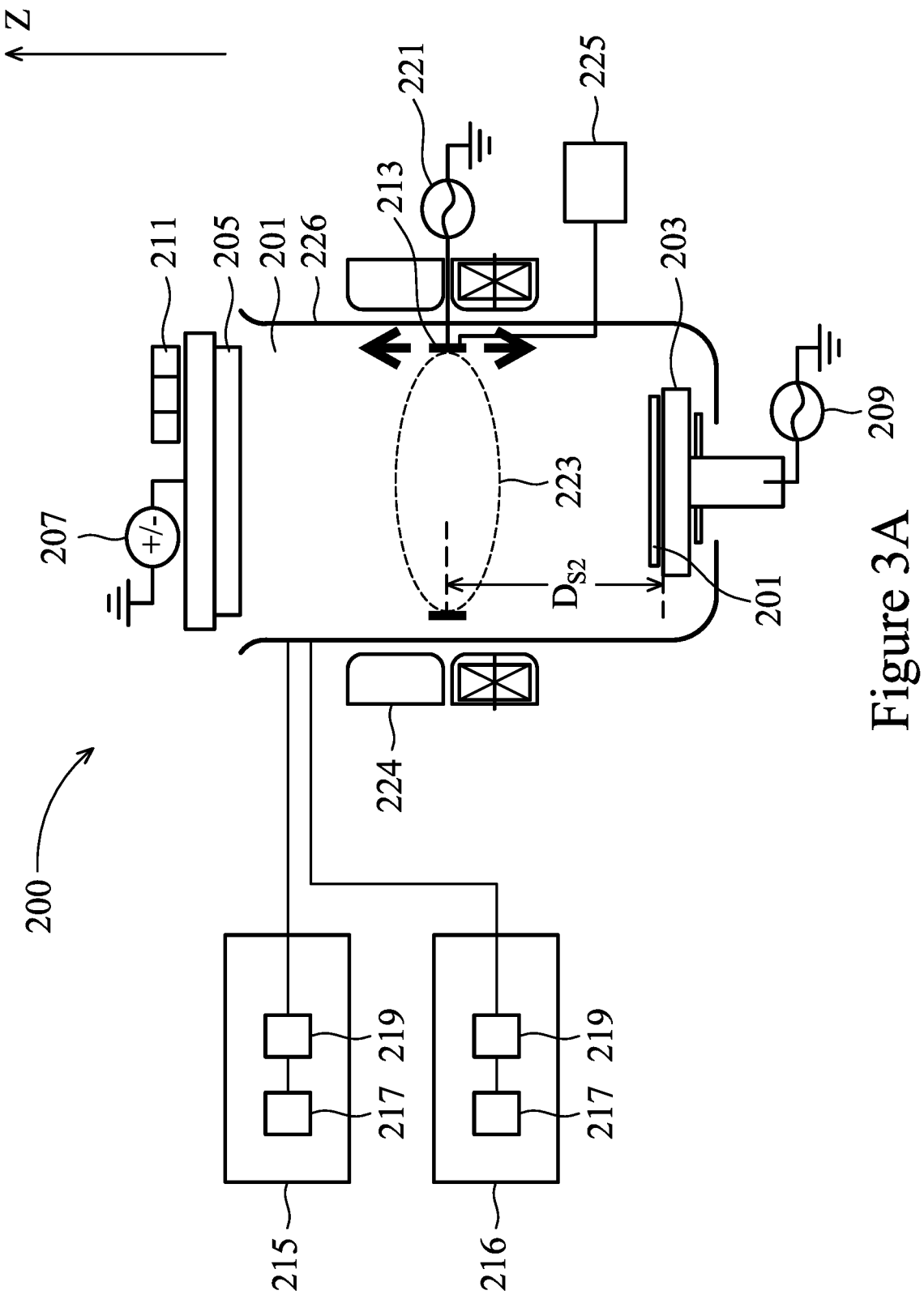
FIGS. 3A-3B illustrate deposition of a second layer of the material within the first opening in accordance with some embodiments.
Figure 3B:
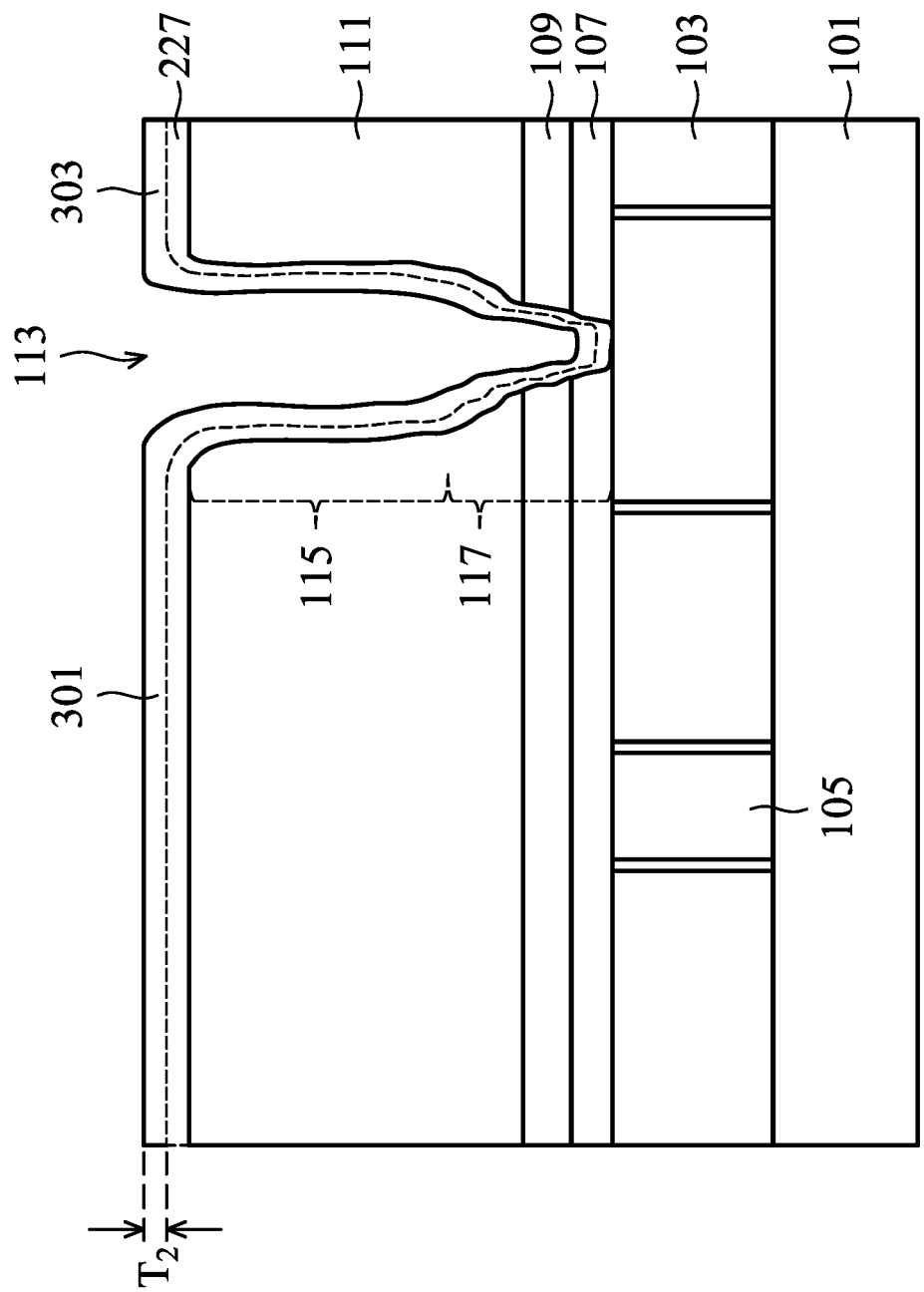

FIGS. 3A-3B illustrate that, once the first layer 227 of the material to be deposited has been formed, a second step of the deposition process may be performed to form an overall barrier layer 301 (with the first layer 227 of the material to be deposited now illustrated using dashed lines). In an embodiment the second step of the deposition process modifies the first step by adjusting the position of the first coil 213 from the first separation distance $D_{S1}$ (utilized in the first step and illustrated in FIG. 2A) to a second separation distance $D_{S2}$ while keeping a remainder of the process parameters the same. By modifying the second separation distance $D_{S2}$, the off angle deposition of the ions and conformality of the deposition may be adjusted. In an embodiment the second separation distance $D_{S2}$ may be between about 0 mm and about 11 mm, such as about 1 mm, although any suitable separation distance may be utilized.

In an embodiment the adjustment of the position of the first coil 213 from the first separation distance $D_{S1}$ to the second separation distance $D_{S2}$ may be performed during the deposition process and without stopping the deposition process. In another embodiment, the adjustment of the position of the first coil 213 from the first separation distance $D_{S1}$ to the second separation distance $D_{S2}$ may be performed during a stoppage of the deposition process, and the deposition process may be restarted once the adjustment of the position of the first coil 213 has been completed. Any suitable steps for adjusting the position of the first coil 213 may be utilized.

As illustrated in FIG. 3B, the second step of the deposition process will form a second layer 303 of the material to be deposited (e.g., tantalum nitride) over the first layer 227 of the material to be deposited. In an embodiment the second step of the deposition process may be continued for a second time period of between about 10 sec and about 1000 sec, such as about 100 sec, which can result in a second thickness $T_2$ of between about 3 Å and about 40 Å, such as about 10 Å. However, any suitable time period and thickness may be utilized.

Similarly, in an embodiment in which the barrier layer 301 is formed from tantalum nitride, and in which nitrogen is added as a non-target precursor, by utilizing these parameters in the second step of the deposition process, the second layer 303 of the material to be deposited may be formed to have a second tantalum to nitrogen ratio (Ta/N) of between about 0.8 and about 2, such as about 1. This gives the overall barrier layer 301 (comprising the first layer 227 and the second layer 303) a gradient composition of tantalum to nitrogen ratios that ranges from between about 0.4 to about 5.

By modifying the separation distance of the first coil 213 relative to the mounting platform 203, the barrier layer 301 (comprising the first layer 227 and the second layer 303) may have an overall improved quality. In particular, the barrier layer 301 may have an overall tantalum to nitrogen ratio of greater than about 1.3, while still obtaining a film density of greater than about 13 g/cm$^3$, and having a resistivity of between about 200 μΩ-cm and about 700 μΩ-cm. Additionally, the barrier layer 301 may obtain a conformal coverage wherein a ratio of the thickness of the barrier layer 301 over the sidewalls of the first opening 113 and a thickness of the barrier layer 301 over the bottom of the first opening 113 is greater than or equal to about 0.7. As such, the benefits of utilizing a physical vapor deposition process (a higher tantalum to nitrogen ratio and greater film density) can be achieved while still obtaining a more conformal deposition.

Figure 4:
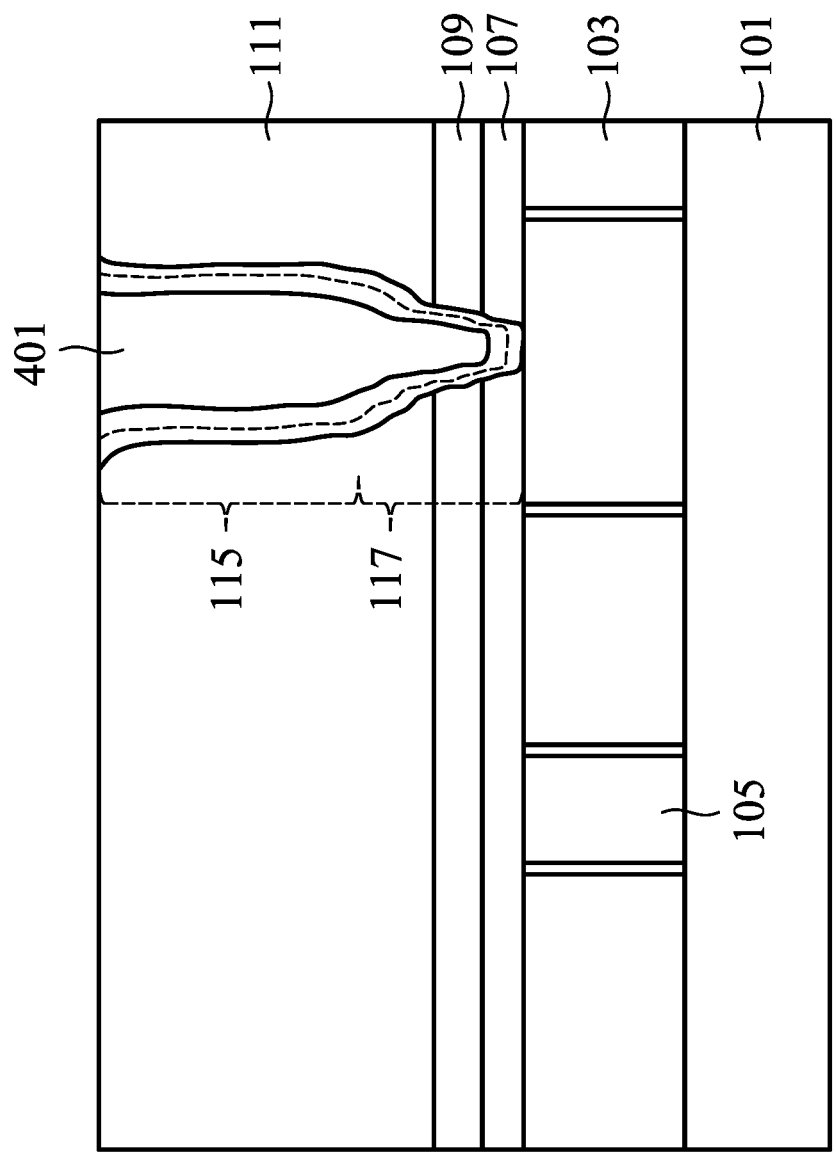
FIG. 4 illustrates formation of an interconnect within the first opening in accordance with some embodiments.

FIG. 4 illustrates that, once the barrier layer 301 has been formed to line the first opening 113, the first opening 113 is filled with a conductive material to form the interconnect 401. The conductive material may comprise copper, although other suitable materials such as aluminum, alloys, doped polysilicon, combinations thereof, and the like, may alternatively be utilized. The conductive material may be formed by depositing a seed layer (not separately illustrated), electroplating copper onto the seed layer, and filling and overfilling the first opening 113. Once the first opening 113 has been filled, excess portions of the barrier layer 301, the seed layer, and the conductive material outside of the first opening 113 may be removed through a planarization process such as chemical mechanical polishing (CMP), although any suitable removal process may be used.

Figure 5A:
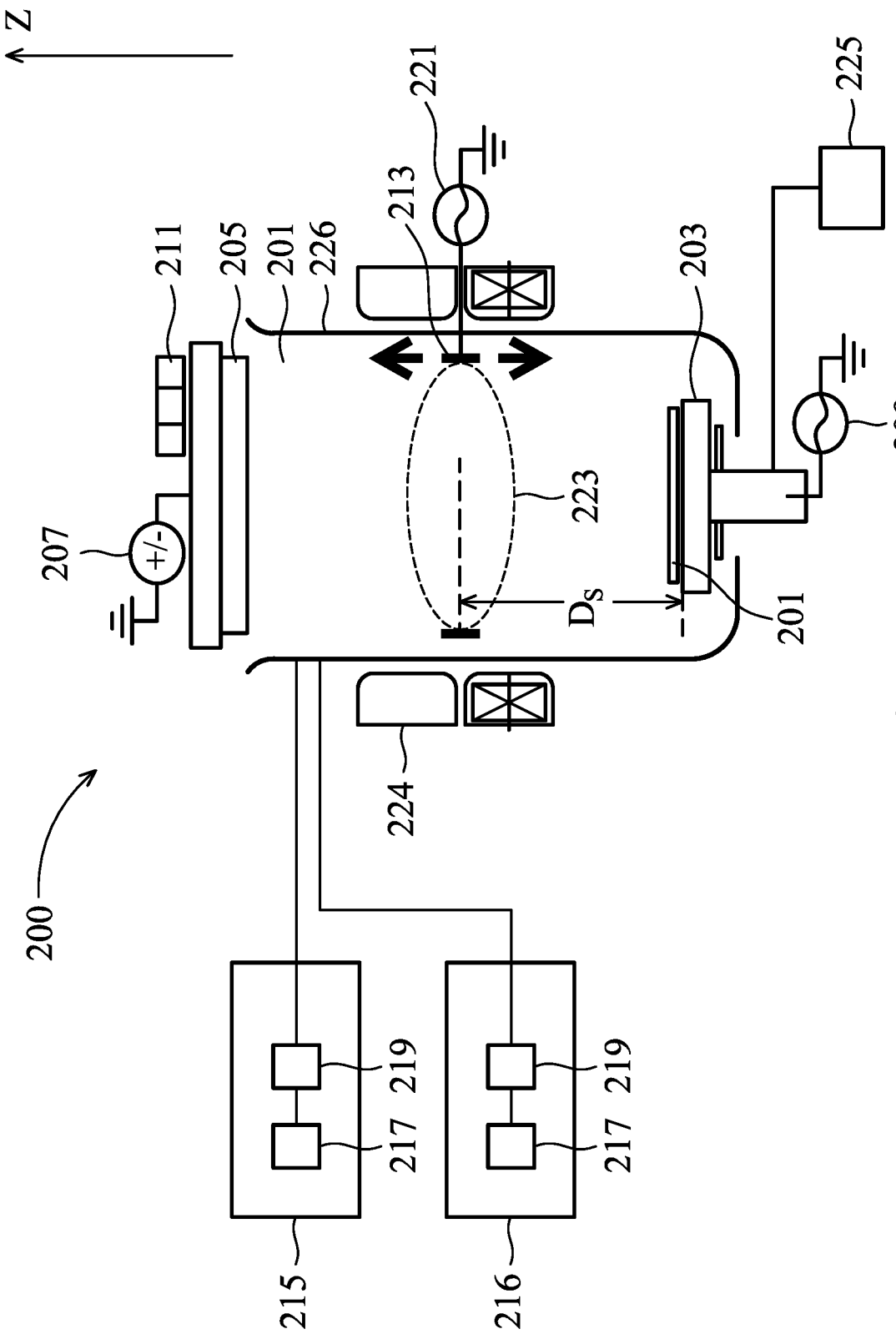
FIGS. 5A-5B illustrate configurations motors connected to a first coil and a mounting platform in accordance with some embodiments.

FIG. 5A illustrates another embodiment in which the separation distance (e.g., the first separation distance $D_{S1}$ and the second separation distance $D_{S2}$) between the mounting platform 203 and the first coil 213 may be adjusted. In this embodiment, instead of attaching the first motor 225 to the first coil 213 in order to move the first coil 213 in the z direction, the first motor 225 is, instead, attached to the mounting platform 203. As such, while the first coil 213 may remain motionless, the first motor 225 may be used to adjust the separation distance by moving the mounting platform 203 to achieve the first separation distance $D_{S1}$ and the second separation distance $D_{S2}$, after the deposition process has been initiated. However, any other suitable method of moving the mounting platform 203 relative to the first coil 213 may be utilized.

Figure 5B:
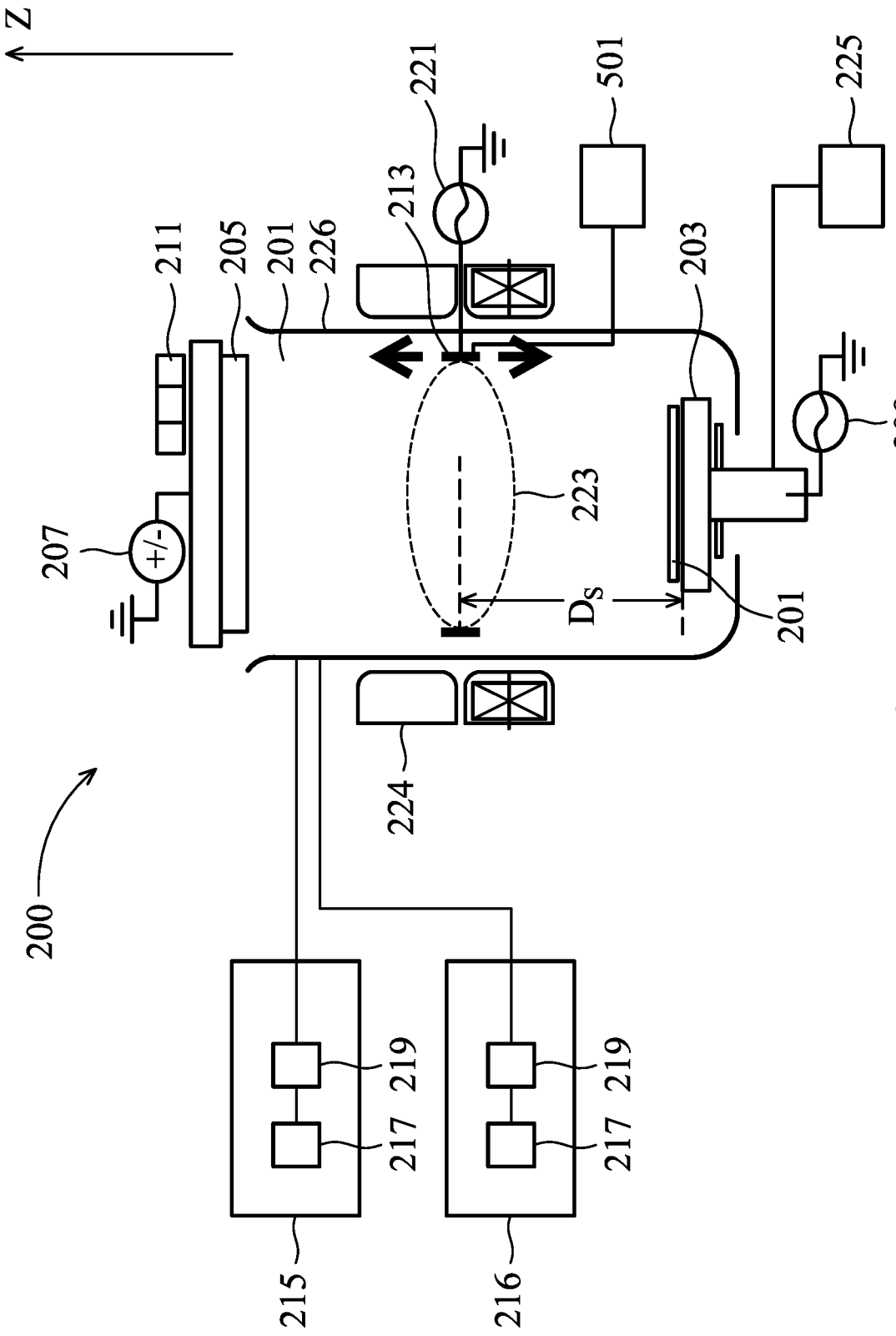

FIG. 5B illustrates yet another embodiment in which the first motor 225 is attached to the mounting platform 203 and a second motor 501 is attached to the first coil 213. In this embodiment the second motor 501 may be similar to the first motor 225 (e.g., a piezoelectric motor), and both the first motor 225 and the second motor 501 may be utilized in conjunction with each other in order to adjust the separation distance between the mounting platform and the first coil 213. However, any other suitable method of moving the mounting platform 203 relative to the first coil 213 may be utilized.

Figure 6:
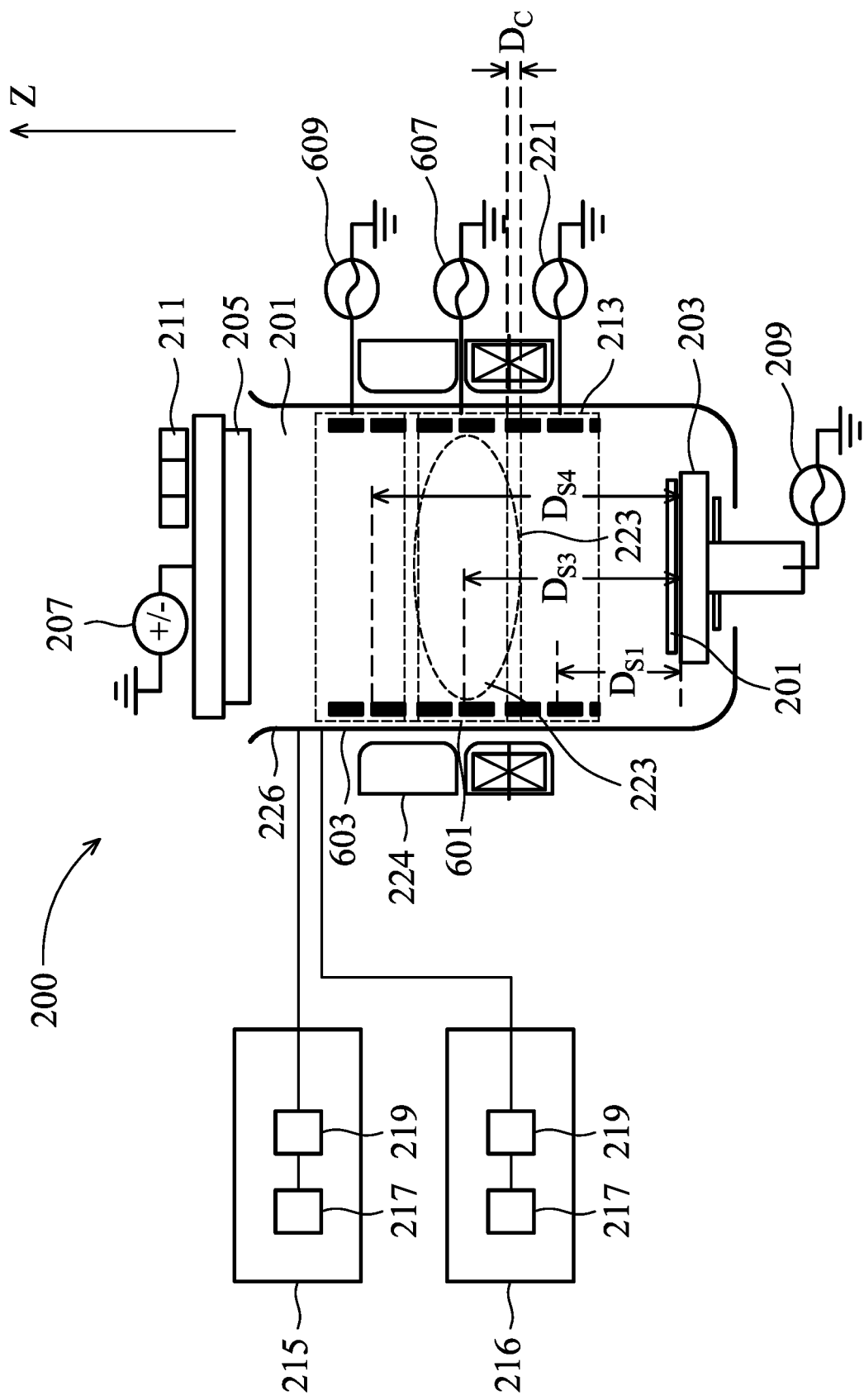
FIG. 6 illustrates multiple coils in accordance with some embodiments.

FIG. 6 illustrates another embodiment in which the first coil 213 remains stationary. In this embodiment, however, instead of adjusting the first electromagnetic field 223 within the deposition chamber 201 by adjusting the separation distance between the first coil 213 and the mounting platform 203, the first electromagnetic field 223 within the deposition chamber 201 is adjusted by adding additional coils, such as a second coil 601 and a third coil 603 (each highlighted in FIG. 6 by the dashed boxes), alongside the first coil 213. In this embodiment the second coil 601 and the third coil 603 may be similar to the first coil 213, such as by being a single conductive line wound around the deposition chamber 201, but electrically separated from the first coil 213. However, in some embodiments the second coil 601 and the third coil 603 may be different from the first coil 213.

In an embodiment the first coil 213, the second coil 601, and the third coil 603 are arranged one on top of the other in the z direction of FIG. 6. Additionally, the first coil 213, the second coil 601, and the third coil 603 may be spaced apart from each other by a coil distance Dc of between about 2 mm and about 15 mm, such as about 3 mm. However, any suitable distances may be utilized.

A fourth power source 607 may be attached to the second coil 601 and a fifth power source 609 may be attached to the third coil 603. In an embodiment the fourth power source 607 and the fifth power source 609 may be similar to the third power source 221 (described above with respect to FIG. 2A). However, each of the third power source 221, the fourth power source 607, and the fifth power source 609 are independent of each other, and each can apply power to their respective coils separately and independently from the others power sources.

In this embodiment, the first layer 227 of the barrier layer 301 may be formed as described above with respect to FIGS. 2A-2C, wherein the first coil 213 is located at the first separation distance $D_{S1}$ from the mounting platform 203. However, in this embodiment, at this point in the deposition process power is not applied to the second coil 601 and the third coil 603. As such, the second coil 601 and the third coil 603 do not actively generate or modify the first electromagnetic field 223 within the deposition chamber 201, and the first layer 227 of the barrier layer 301 is deposited with solely the first coil 213 being active.

Once the first layer 227 has been deposited to the desired thickness (e.g., the first thickness $T_1$), the second layer 303 of the barrier layer 301 may be deposited using a second step of the deposition process in which the fourth power source 607 applies power to the second coil 601, the fifth power source 609 applies power to the third coil 603, or both the fourth power source 607 and the fifth power source 609 apply power to the second coil 601 and the third coil 603 simultaneously. For example, the fourth power source 607 may apply to the second coil 601 a power of between about 0 W and about 8,000 W, such as about 2,000 W, while the fifth power source 609 may be apply to the third coil 603 a power of between about 0 W and about 8,000 W, such as about 2,000 W. While the second coil 601 and the third coil 603 are being used, the first coil 213 may either be used (by maintaining power to the first coil 213) or else turned off (by removing power from the first coil 213). However, any suitable power or combinations of power may be applied.

By adding the use of the second coil 601 and the third coil 603, the first electromagnetic field 223 within the deposition chamber 201 may be modified during the deposition process. As such, the off angle deposition and ionization area may also be modified in order to create a more conformal deposition process, and the barrier layer 301 (comprising both the first layer 227 and the second layer 303) may be formed with the overall tantalum to nitrogen ratio of greater than about 0.9, while still obtaining a film density of greater than about 11 g/cm$^3$. Additionally, the barrier layer 301 may obtain a conformal coverage wherein a ratio of the thickness of the barrier layer 301 over the sidewalls of the first opening 113 and a thickness of the barrier layer 301 over the bottom of the first opening 113 is greater than or equal to about 0.7.

Additionally, while an embodiment is described above which utilizes three coils (e.g., the first coil 213, the second coil 601, and the third coil 603), this description is intended to be illustrative and is not intended to be limiting. Rather, any suitable number of separate coils, such as between two coils and ten coils, such as two or three coils, may also be utilized. Any suitable combination of coils may be used and all such combinations are fully intended to be included within the scope of the embodiments.

Once the barrier layer 301 is formed utilizing the multiple coils, the first opening 113 may be filled as described above with respect to FIG. 4 in order to form the interconnect 401. For example, a seed layer may be deposited and a conductive material may be plated onto the seed layer before a chemical mechanical polishing process to remove excess material of the barrier layer 301, the seed layer and the conductive material. However, any suitable processing may be performed.

Figure 7A:
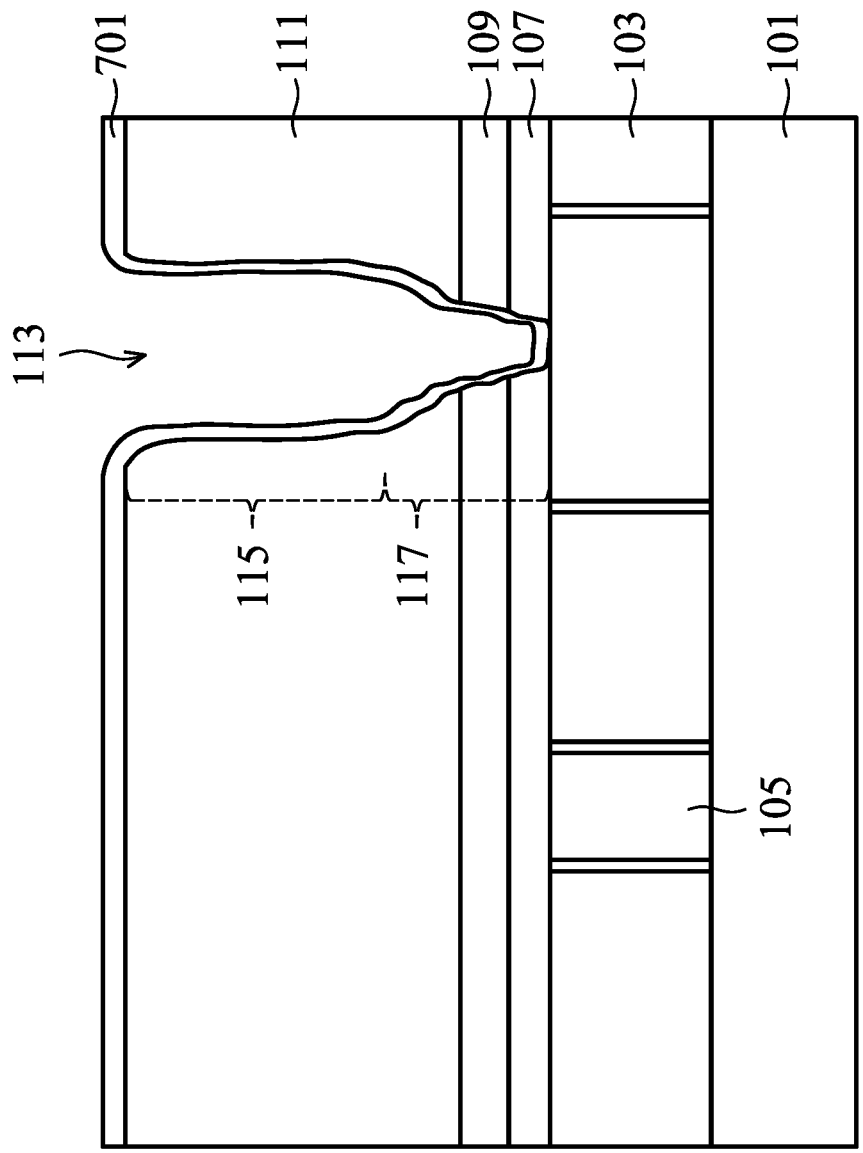

FIGS. 7A-7B illustrate another embodiment in which the physical vapor deposition processes described in FIGS. 1-6 are utilized in conjunction with another deposition process, such as an atomic layer deposition (ALD) process or chemical vapor deposition (CVD) process, to form the barrier layer 301. In this embodiment, and as illustrated in FIG. 7B, the substrate 101 and, hence, the first opening 113 may initially be placed within an ALD deposition system 700 with an ALD deposition chamber 702 on an ALD mounting platform 707. In an embodiment the ALD deposition chamber 702 and the ALD mounting platform 707 may be similar to the deposition chamber 201 and the mounting platform 203 as described above with respect to FIG. 2A, although the ALD deposition chamber 702 may not include structure which are specific to the PVD processes, such as the electromagnets 224, the magnetron 211, or the target 205.

The ALD deposition system 700 also comprises a second precursor delivery system 703 and a third precursor delivery system 705 positioned to inject desired precursors (discussed further below) into the ALD deposition chamber 702. In an embodiment the second precursor delivery system 703 and the third precursor delivery system 705 are similar to the first precursor delivery system 215, such as by comprising a gas supply 217 and a flow controller 219. However, any suitable components may be utilized.

The formation of the third layer 701 may be initiated by putting a second precursor material into the second precursor delivery system 703. For example, in an embodiment in which the third layer 701 is tantalum nitride, the second precursor material may be a precursor such as (tert-butylimido)tris(diethylamido) tantalum (TBTDET) and may be placed into the second precursor delivery system 703. However, as one of ordinary skill in the art will recognize, this precursor is not the only precursor that may be utilized to form a layer of tantalum nitride, and the use of TBTDET is not intended to be limiting to the embodiments. Any suitable precursor material in any suitable phase (solid, liquid, or gas) to form a layer of tantalum nitride, such as PDMAT or TAIMATA, or any other precursor that may be used to form alternative layers, may be utilized.

Additionally, a third precursor material may be placed into the third precursor delivery system 705. In the embodiment in which a layer of tantalum nitride is the desired material for the third layer 701 of the barrier layer 301, the third precursor material may be a precursor material that may contain nitrogen in order to react with the second precursor material to form a monolayer of tantalum nitride. For example, in the embodiment in which TBTDET is utilized as the second precursor material, ammonia ($NH_3$) may be used as the third precursor material and may be placed into the third precursor delivery system 705. However, the description of ammonia as the third precursor material is not intended to be limiting to the embodiments, and any other suitable precursor material, such as $N_2H_4$, combinations of these, or the like, may also be utilized as the third precursor material.

Once the second precursor material and the third precursor material have been placed into the second precursor delivery system 703 and the third precursor delivery system 705, respectively, the formation of the third layer 701 may be initiated by the control unit 233 sending an instruction to connect the second precursor delivery system 703 to the ALD deposition chamber 702. Once connected, the second precursor delivery system 703 can deliver the second precursor material (e.g., the TBTDET) to the ALD deposition chamber 702, wherein the second precursor material can be adsorbed and react to the exposed surfaces of the first dielectric layer 111.

As the second precursor material is adsorbed onto the first dielectric layer 111, the second precursor material will react with open active sites located on the exposed surfaces of the first dielectric layer 111. However, once all of the open active sites on the first dielectric layer 111 have reacted with the second precursor material, the reaction will stop, as there are no more open active sites to which the second precursor material will bond. This limitation causes the reaction of the second precursor material with the first dielectric layer 111 to be self-limiting and to form a monolayer of the reacted second precursor material on the surface of the first dielectric layer 111, thereby allowing for a more precise control of the thickness of the third layer 701.

After the self-limiting reaction on the first dielectric layer 111 has finished, the ALD deposition chamber 702 may be purged of the second precursor material. For example, the control unit 233 may disconnect the second precursor delivery system 703 (containing the second precursor material to be purged from the ALD deposition chamber 702) and to connect a purge gas delivery system (not separately illustrated) to deliver a purge gas to the ALD deposition chamber 702. In an embodiment the purge gas delivery system may be a gaseous tank or other facility that provides a purge gas such as nitrogen, argon, xenon, or other non-reactive gas to the ALD deposition chamber 702. Additionally, the control unit 233 may also initiate a vacuum pump in order to apply a pressure differential to the ALD deposition chamber 702 to aid in the removal of the second precursor material. The purge gas, along with the vacuum pump, may purge the second precursor material from the ALD deposition chamber 702 for about 3 seconds.

After the purge of the second precursor material has been completed, the introduction of the third precursor material (e.g., ammonia) to the ALD deposition chamber 702 may be initiated by the control unit 233 disconnecting the purge gas delivery system and connecting the third precursor delivery system 705 (containing the third precursor material) to the ALD deposition chamber 702. Once connected, the third precursor delivery system 705 can deliver the third precursor material to the ALD deposition chamber 702, wherein the third precursor material can be adsorbed on the surfaces of the first dielectric layer 111 and react with the second precursor material in another self-limiting reaction to form a monolayer of the desired material, e.g., tantalum nitride, on the surface of the first dielectric layer 111.

After the monolayer of the desired material, e.g., tantalum nitride, has been formed, the ALD deposition chamber 702 may be purged (leaving behind the monolayer of the desired material on the first dielectric layer 111) using, e.g., a purge gas from the purge gas delivery system for about three seconds. After the ALD deposition chamber 702 has been purged, a first cycle for the formation of the desired material has been completed, and a second cycle similar to the first cycle may be started. For example, the repeated cycle may introduce the second precursor material, purge with the purge gas, pulse with the third precursor material, and purge with the purge gas. These cycles may be repeated until the third layer 701 has the desired thickness.

However, as one of ordinary skill in the art will recognize, the above described process to form the third layer 701 is intended to be illustrative and is not intended to be limiting to the embodiments. Any other suitable process, such as initially pulsing the third precursor material (e.g., ammonia), purging with the purge gas, introducing the second precursor material (e.g., TBTDET), and purging with the purge gas to complete a first cycle and then repeating the first cycle, may also be utilized. This and any other suitable process to form the third layer 701 are fully intended to be included within the scope of the embodiments.

Figure 8A:
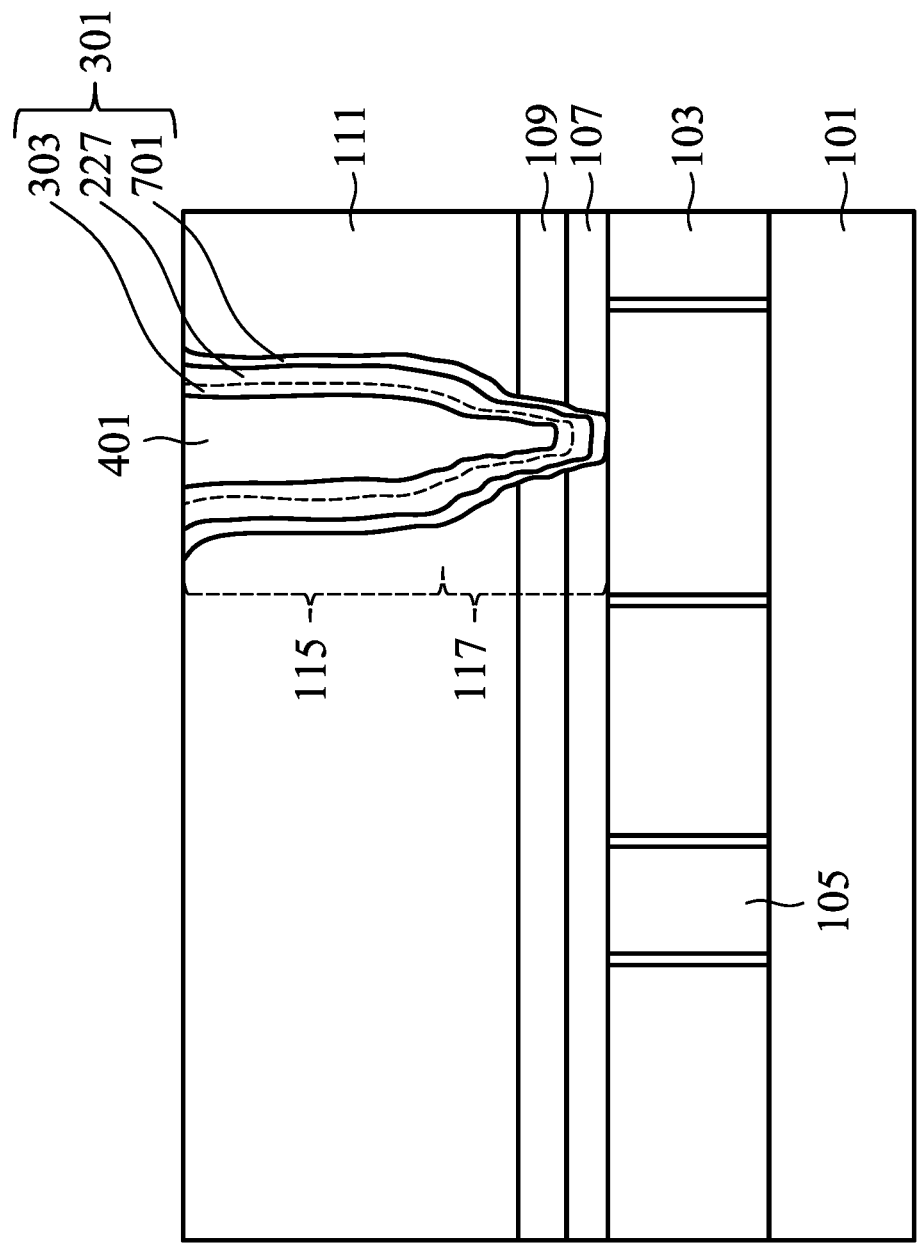
FIGS. 8A-8B illustrate formation of an interconnect within the first opening in accordance with some embodiments.
Figure 8B:
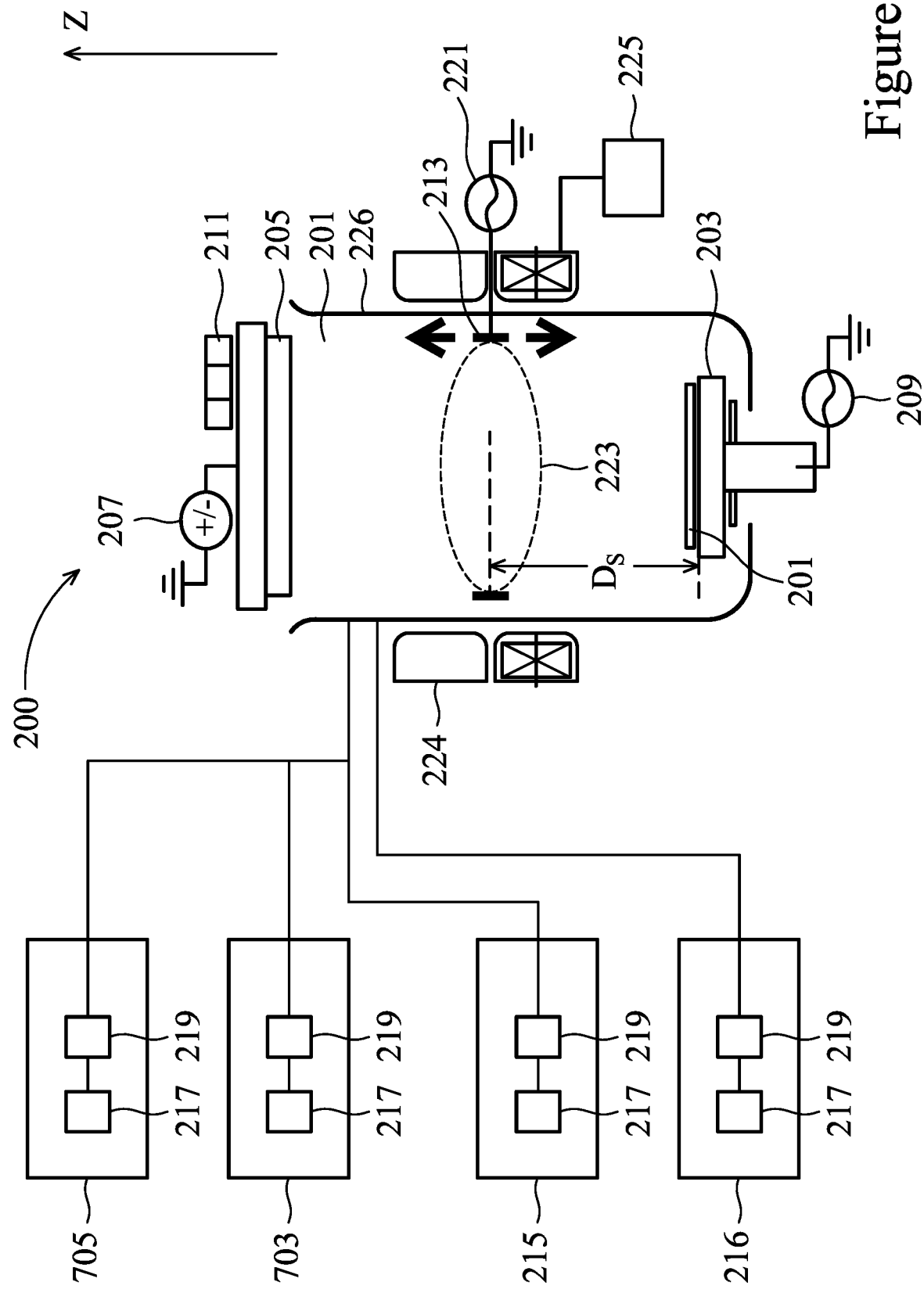

FIGS. 8A-8B illustrate that, once the third layer 701 of the barrier layer 301 has been formed, the substrate 101 may be placed into the deposition system 200 in order to form the first layer 227 of the barrier layer 301 and the second layer 303 of the barrier layer 301 over the third layer 701. In an embodiment the first layer 227 of the barrier layer 301 and the second layer 303 of the barrier layer 301 may be formed as described in any of the embodiments discussed above with respect to FIGS. 1-6. For example, the first layer 227 of the barrier layer 301 may be formed with the first coil 213 located at the first separation distance $D_{S1}$ and the second layer 303 of the barrier layer 301 may be formed after the first coil 213 has been moved to the second separation distance $D_{S2}$. However, any suitable method of forming the first layer 227 of the barrier layer 301 and the second layer 303 of the barrier layer 301 may be utilized.

FIG. 8A also illustrates that, once the barrier layer 301 has been formed with the third layer 701, the remainder of the first opening 113 may be filled as described above with respect to FIG. 4 in order to form the interconnect 401. For example, a seed layer may be deposited and a conductive material may be plated onto the seed layer before a chemical mechanical polishing process to remove excess material of the barrier layer 301, the seed layer and the conductive material. However, any suitable processing may be performed.

Additionally, while the embodiment discussed in FIGS. 7A-8B is described as forming the third layer 701 first, this is intended to be illustrative and is not intended to be limiting. Rather, in other embodiments the first layer 227 of the barrier layer 301 and the second layer 303 of the barrier layer 301 may be formed prior to formation of the third layer 701. Further, if desired, the third layer 701 may be formed in a single cluster tool without breaking atmosphere or else may be performed in separate machines than the first layer 227 of the barrier layer 301 and the second layer 303 of the barrier layer 301. This and all other suitable combinations are fully intended to be included within the scope of the embodiments.

By modifying the combination of deposition processes along with modifying the first electromagnetic field 223, the barrier layer 301 (comprising the first layer 227, the second layer 303, and the third layer 701) may have an overall improved quality. In particular, the barrier layer 301 may have an overall tantalum to nitrogen ratio of greater than about 0.9, while still obtaining a film density of greater than about 11 g/cm$^3$. Additionally, the barrier layer 301 may obtain a conformal coverage wherein a ratio of the thickness of the barrier layer 301 over the sidewalls of the first opening 113 and a thickness of the barrier layer 301 over the bottom of the first opening 113 is greater than or equal to about 0.7. As such, the benefits of utilizing a physical vapor deposition process (a higher tantalum to nitrogen ratio and greater film density) can be achieved while still obtaining a more conformal deposition.

Additionally, the more conformal deposition also helps to reduce or eliminate overhangs, insufficient sidewall coverage, or thicker depositions at the bottom of the vias while still avoiding the low density, nitrogen rich, high resistivity that normally comes with a pure ALD process. As such, the properties that can be achieved with PVD can be maintained while still achieving an ALD-like coverage. This allows for a larger process window (due to less overhang) and an overall better treatment efficiency.

In an embodiment, a method of manufacturing a semiconductor device includes sputtering in a first chamber a first portion of a barrier material onto a substrate on a mounting platform, wherein during the sputtering the first portion of the barrier material a first coil is situated a first distance away from the mounting platform, the mounting platform being located at a first location; and sputtering in the first chamber a second portion of the barrier material onto the substrate, wherein during the sputtering the second portion of the barrier material the first coil is situated a second distance away from the mounting platform, the second distance being different from the first distance, the mounting platform being located at the first location. In an embodiment the sputtering the second portion of the barrier material further comprises moving the first coil without moving the mounting platform. In an embodiment the sputtering the second portion of the barrier material further comprises moving the mounting platform without moving the first coil. In an embodiment the method further includes, prior to the sputtering the first portion of the barrier material, depositing an atomic layer deposition portion of the barrier material, wherein the depositing the atomic layer deposition portion is performed at least in part with an atomic layer deposition process. In an embodiment the first portion of the barrier material and the second portion of the barrier material collectively have a tantalum to nitrogen ratio of greater than 0.9. In an embodiment the first portion of the barrier material and the second portion of the barrier material collectively have a ratio between a sidewall thickness and a bottom thickness of greater than or equal to 0.7. In an embodiment the first portion of the barrier material and the second portion of the barrier material collectively have a density of greater than 11 g/cm$^3$.

In another embodiment a method of manufacturing a semiconductor device includes applying a first power to a first coil; during the applying the first power to the first coil, sputtering a first portion of a barrier material onto a substrate; after the sputtering the first portion of the barrier material, applying a second power to a second coil separate from the first coil; and during the applying the second power to the second coil, sputtering a second portion of the barrier material onto the substrate. In an embodiment the method further includes, after the sputtering the first portion of the barrier material, applying a third power to a third coil separate from the first coil and the second coil; and during the applying the second power to the second coil and during the applying the third power to the third coil, sputtering the second portion of the barrier material onto the substrate. In an embodiment the method further includes, prior to applying the first power to the first coil, depositing a first atomic layer deposition portion of the barrier material onto the substrate, the depositing the first atomic layer deposition portion being performed at least in part using an atomic layer deposition process. In an embodiment the first portion of the barrier material and the second portion of the barrier material collectively have a density of greater than about 11 g/cm$^3$. In an embodiment the barrier material is tantalum nitride. In an embodiment the first portion of the barrier material and the second portion of the barrier material collectively have a tantalum to nitrogen ratio of greater than 0.9. In an embodiment the first portion of the barrier material and the second portion of the barrier material collectively have a thickness ratio of greater than or equal to 0.7.

In yet another embodiment a deposition system includes a first deposition chamber; a target region within the first deposition chamber; a mounting platform within the first deposition chamber opposite the target region, a first region located between the target region and the mounting platform; a first coil surrounding the first region; and a first motor attached to the first coil, wherein the first motor is positioned to adjust a distance between the first coil and the mounting platform. In an embodiment the deposition system further includes a target within the target region. In an embodiment the target comprises a first material and the first coil comprises the first material. In an embodiment the deposition system further includes a second motor attached to the mounting platform. In an embodiment the deposition system further includes a nitrogen-containing precursor input to the first deposition chamber. In an embodiment the deposition system further includes a first atomic layer deposition precursor input to a second deposition chamber; and a second atomic layer deposition precursor input to the second deposition chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deposition system comprising:
   a first deposition chamber;
   a target within the first deposition chamber;
   a mounting platform within the first deposition chamber;
   a first coil within the first deposition chamber;

a first power source connected to the first coil;
a second coil within the first deposition chamber;
a second power source connected to the second coil;
a third coil within the first deposition chamber;
a third power source connected to the third coil, wherein the first power source, the second power source and the third power source are each different; and
a second deposition chamber, the second deposition chamber connected to a second precursor delivery system, the second deposition chamber being an atomic layer deposition chamber.

2. The deposition system of claim 1, further comprising a first precursor delivery system connected to the first deposition chamber, and a first ion delivery system connected to the first deposition chamber.

3. The deposition system of claim 1, further comprising a third precursor delivery system connected to the second deposition chamber, the third precursor delivery system being different from the second precursor delivery system.

4. The deposition system of claim 1, wherein the target comprises tantalum.

5. The deposition system of claim 1, wherein the first power source is a radio-frequency power source with a first power between about 1 MHz and about 40 MHz.

6. The deposition system of claim 1, further comprising a direct current power source connected to the target.

7. The deposition system of claim 1, wherein the target is not within the second deposition chamber.

8. A deposition system comprising:
a deposition chamber;
a target within the deposition chamber;
a first coil within the deposition chamber;
a mounting platform within the deposition chamber;
a first coil location;
a second coil location, the second coil location being different from the first coil location, wherein the first coil is movable between the first coil location and the second coil location;
a second deposition chamber, wherein the second deposition chamber is an atomic layer deposition chamber;
a first atomic layer deposition precursor input to the second deposition chamber; and
a second atomic layer deposition precursor input to the second deposition chamber.

9. The deposition system of claim 8, further comprising a first motor connected to the first coil.

10. The deposition system of claim 9, further comprising a first mounting platform location and a second mounting platform location, wherein the mounting platform is movable between the first mounting platform location and the second mounting platform location.

11. The deposition system of claim 10, further comprising a second motor connected to the mounting platform.

12. The deposition system of claim 8, further comprising a direct current power source connected to the target.

13. The deposition system of claim 8, further comprising a radio-frequency power source connected to the target.

14. The deposition system of claim 8, wherein the first coil and the target comprise a same material.

15. A deposition system comprising:
a first deposition chamber;
a target region within the first deposition chamber;
a mounting platform within the first deposition chamber opposite the target region, a first region located between the target region and the mounting platform;
a first coil surrounding the first region;
a first motor attached to the first coil, wherein the first motor is positioned to adjust a distance between the first coil and the mounting platform;
a nitrogen-containing precursor input to the first deposition chamber;
a first atomic layer deposition precursor input to a second deposition chamber; and
a second atomic layer deposition precursor input to the second deposition chamber.

16. The deposition system of claim 15, further comprising a target within the target region.

17. The deposition system of claim 16, wherein the target comprises a first material and the first coil comprises the first material.

18. The deposition system of claim 15, further comprising a second motor attached to the mounting platform.

19. The deposition system of claim 15, wherein the target region is not within the second deposition chamber.

20. The deposition system of claim 15, wherein the first atomic layer deposition precursor input is a tantalum-containing precursor input and the second atomic layer deposition precursor input is a second nitrogen-containing precursor input different from the nitrogen-containing precursor input to the first deposition chamber.

* * * * *